United States Patent [19]
Malhi

[11] Patent Number: 6,084,778
[45] Date of Patent: Jul. 4, 2000

[54] THREE DIMENSIONAL ASSEMBLY USING FLEXIBLE WIRING BOARD

[75] Inventor: Satwinder Malhi, Garland, Tex.

[73] Assignee: Texas Instruments Incorporated, Dallas, Tex.

[21] Appl. No.: 09/069,494

[22] Filed: Apr. 29, 1998

Related U.S. Application Data

[60] Provisional application No. 60/044,429, Apr. 29, 1997.

[51] Int. Cl.<sup>7</sup> ...................................................... H05K 1/00
[52] U.S. Cl. .......................... 361/749; 361/760; 174/254; 439/77; 29/830
[58] Field of Search ..................................... 361/748–751, 361/784, 789, 792–794, 803, 760; 174/254, 268; 439/67, 77; 396/542; 324/765; 257/686, 700, 701, 702, 723, 724, 773; 29/830, 832, 846

[56] References Cited

U.S. PATENT DOCUMENTS

| | | | |
|---|---|---|---|
| 3,633,189 | 1/1972 | Billawala | 439/77 |
| 4,561,709 | 12/1985 | Fukukura | 439/77 |
| 4,711,548 | 12/1987 | Arakawa et al. | 396/542 |
| 4,997,377 | 3/1991 | Goto et al. | 439/67 |
| 5,117,282 | 5/1992 | Salatino | 361/749 |
| 5,204,806 | 4/1993 | Sasaki et al. | 361/749 |
| 5,213,512 | 5/1993 | Campbell et al. | 439/77 |
| 5,313,416 | 5/1994 | Kimura | 439/77 |

Primary Examiner—Leo P. Picard
Assistant Examiner—John B. Vigushin
Attorney, Agent, or Firm—Wade James Brady, III; Frederick J. Telecky, Jr.

[57] ABSTRACT

A printed circuit, printed wiring board and method of making same which includes a flexible rectangular strip (1) having an interconnect pattern thereon. A plurality of flaps (5, 5'), (7, 7'), (9, 9') of substantially equal length extends laterally from one of the sides of the rectangular strip, at least one flap having a narrow width dimension and the terminal flap having a relatively wide width dimension sufficient to overlap the other flaps. The width of the flaps having a narrow width are sufficient to contact the overlapping flap. A patterned interconnect is disposed on the rectangular strip and extends onto the flaps. A plurality of electrical components (11) is coupled to the interconnect and disposed in the region opposed to the flaps. The narrow flaps extend toward the wider flap and the wide flap extends toward the narrow flaps and extends over the narrow flaps. The interconnects are interconnected on the flaps. The board includes a plurality of layers of electrically insulating material and the patterned interconnect is disposed between the layers of electrically insulating material.

20 Claims, 1 Drawing Sheet

6,084,778

THREE DIMENSIONAL ASSEMBLY USING FLEXIBLE WIRING BOARD

This application claims priority under 35 USC § 119(e)(1) of provisional application Ser. No. 60/044,429 filed Apr. 29, 1997.

BACKGROUND OF THE INVENTION

1. Field of the Invention

This invention relates to a method of providing more efficient volume packaging for system applications and, more specifically, to such packaging by forming a three dimensional printed wiring board circuit assembly and the assembly.

2. Brief Description of the Prior Art

Three dimensional packaging assemblies for semiconductor devices using a flexible printed wiring board have not been known in the prior art. Flexible printed wiring boards have been known in the prior art, however their use has generally been restricted to those uses wherein the interconnect pattern thereon was required to traverse a generally tortuous, nonlinear path, such as travel through a three dimensional space.

Most of the prior art three dimensional packaging assemblies and techniques, in general, have been relatively expensive and have been limited to simple interconnect needs, such as for memories.

SUMMARY OF THE INVENTION

In accordance with the present invention, there is provided a three dimensional packaging assembly which is easy to assemble and which can be assembled at far less cost than the present prior art three dimensional circuits.

Briefly, the above is accomplished by providing a specially designed flexible printed wiring board. The flexible printed wiring board is formed of an electrically insulating material, for example, polyimide. The board can be a single layer of said electrically insulating material or plural layers of said electrically insulating material with layers of patterned interconnect disposed on one or both sides of each layer. The interconnect layers can themselves be interconnected through vias extending through the electrically insulating material. The board has a central strip region with an interconnect pattern thereon onto which semiconductor devices and/or other devices will be secured and make contact to the interconnect pattern.

The board includes a plurality of flaps, singly or in pairs, each flap or pair of flaps spaced sufficiently from the immediately adjacent flaps to permit bending of the board between each pair of flaps and stacking of the components secured to the board. The single and/or plural level interconnect pattern extends onto the flaps and can be on one or both sides of the board as well as in intermediate levels, if present. All of the flaps are relatively narrow except the flap or flaps at one of the ends of the board which is of sufficient width to overlap each of the narrow and underlying flaps. The narrow flaps are generally of a width such that they do not overlap the flap on the immediately adjacent level, yet extend outwardly sufficiently to contact the wide flap or flaps.

The flexible printed wiring board has integrated circuits and/or other electrical components secured thereto and to the interconnect pattern in standard manner and before stacking of the components. The interconnect pattern on the printed wiring board can be a single layer on one or both sides of a single electrically insulating layer or it can have plural layers of electrically insulating material with an interconnect pattern between each layer of electrically insulating material as well as on the outer surfaces of the electrically insulating material.

The flexible printed wiring board, is then folded at the regions of the printed wiring board between the adjacent flaps to provide the three dimensional circuit wherein the printed wiring board has been folded back upon itself in a direction normal to the long dimension of the strip at each region of the strip between the flaps. When so folded, the narrow flaps extend in a direction toward the wide flaps and the wide flaps extend in the direction of the narrow flaps. In this way, the interconnect pattern on the narrow flaps can be interconnected with the interconnect pattern on the wide flap or flaps, thereby short circuiting the electrical path of signals travelling between components on the printed wiring board which are far removed from each other to provide path shortening between remote components. Such path shortening minimizes electrical problems including delays inherent in long interconnect paths by short circuiting such delays in the vertical dimension.

DESCRIPTION OF THE PREFERRED EMBODIMENT

Figures 1, 2, 3:
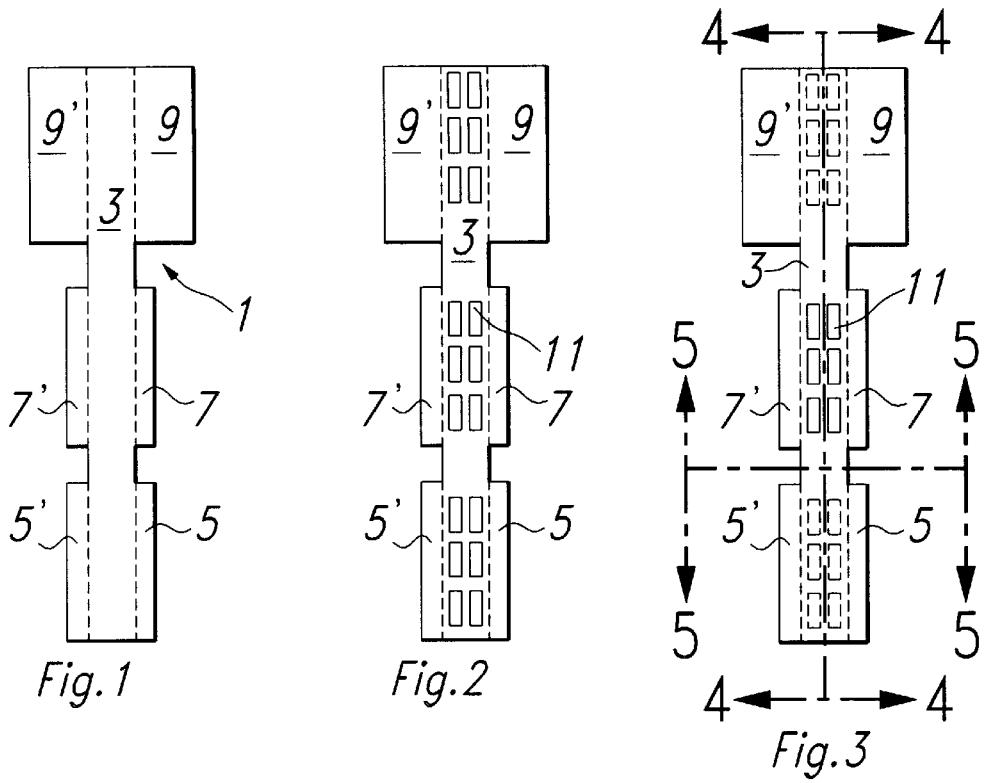
FIG. 1 is a top view of a flexible printed wiring board in accordance with the present invention.
FIG. 2 is a top view of a three dimensional assembly in accordance with the present invention prior to folding of the flexible printed wiring board into a three dimensional configuration.
FIG. 3 is a bottom view of a three dimensional assembly in accordance with the present invention prior to folding of the flexible printed wiring board into a three dimensional configuration.

Referring first to FIG. 1, there is shown a flexible printed wiring board 1 of electrically insulating material, preferably polyimide. The board can be a single layer of electrically insulating material or plural layers of electrically insulating material with layers of patterned interconnect disposed on one or both sides of each layer. The interconnect layers can themselves be interconnected through vias extending through the electrically insulating material, all in standard manner. The board 1 has a central strip region 3 with an interconnect pattern (not shown) thereon and/or therewithin onto which semiconductor devices and/or other devices will be secured and make contact to the interconnect pattern.

The board 1 includes a plurality of pairs of flaps 5,5', 7,7' and 9,9', each pair of flaps spaced sufficiently from the immediately adjacent flaps to permit bending of the board between each pair of flaps and stacking as will be discussed hereinbelow. It should be understood that the flaps with the prime (') can be removed and provide the same result, the arrangement without the primed (') flaps merely limiting the area for interconnection and possibly requiring some interconnect lines to extend entirely across the board rather than exiting to a primed (') flap. The single and/or plural level interconnect pattern extends onto the flaps and can be on one or both sides of the board 1 as well as in intermediate levels, if present, as discussed above. The flaps 9,9' are of sufficient width to overlap each of the underlying flaps 5,5' and 7,7' and the flaps 5,5' and 7,7' are generally of a width such that they do not overlap the flap on the immediately adjacent level, yet extend outwardly sufficiently to be able to contact the flaps 9,9' and the interconnect thereon with the interconnects of flaps 5,5' and 7,7'.

Referring now to FIGS. 2 and 3, there is shown the flexible printed wiring board 1 of FIG. 1 with integrated circuits and/or other electrical components 11 secured thereto and before stacking of the components. As can be seen in FIG. 2, all of the integrated circuits shown are on the top side whereas in FIG. 3, the integrated circuits shown with solid lines are on the bottom side and the integrated circuits shown in phantom are the same integrated circuits as shown on the top side in FIG. 2. The components 11 are disposed so that they oppose the flaps 5,5', 7,7' and 9,9' and are not located in the strip region 3 between the flaps to permit bending of the board 1 in the region of the strip 3 between the flaps. The interconnect pattern on the printed wiring board 1 can be a single layer on one or both sides of a single electrically insulating layer or it can have plural layers of electrically insulating material with an interconnect pattern between each layer of electrically insulating material as well as on the outer surfaces of the electrically insulating material.

Figure 4:
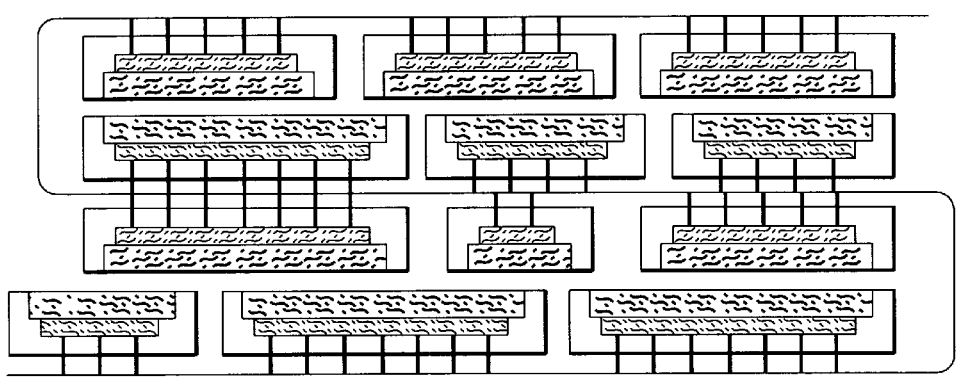
FIG. 4 is a cross sectional view of the three dimensional assembly of FIG. 3 along the line 4—4 after the flexible printed wiring board has been folded into a three dimensional configuration.
Figure 5:
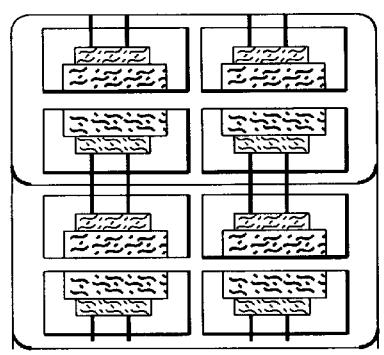
FIG. 5 is a cross sectional view of the three dimensional assembly of FIG. 3 along the line 5—5 after the flexible printed wiring board has been folded into a three dimensional configuration.

Referring now to FIGS. 4 and 5, there is shown the flexible printed wiring board of FIGS. 2 and 3 after it has been folded up by folding in the region of the strip 3 between the flaps to provide the three dimensional circuit. As can be seen the printed wiring board 1 has been folded back upon itself in a direction normal to the long dimension of the strip 3 at each region of the strip between the flaps. When so folded, the narrow flaps 5,5' and 7,7' extend in a direction toward the wide flaps 9,9' and the wide flaps 9,9' extend in the direction of the narrow flaps and overlies the narrow flaps. In this way, the interconnect pattern on the flaps 5,5' and 7,7' is interconnected with the interconnect pattern on the flap 9,9', thereby short circuiting the electrical path of signals travelling between components on the printed wiring board 1 which are far removed from each other. Such path shortening minimizes electrical problems inherent in long interconnect paths.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A method of fabricating a three dimensional electrical circuit package which comprises the steps of:
   (a) providing a flexible rectangular printed circuit board having a length and width dimension much greater than the thickness dimension thereof and having an interconnect pattern thereon comprising a portion of said thickness dimension, said board having a series of spaced apart flaps extending laterally from at least one side of said board with said interconnect pattern extending onto said flaps;
   (b) disposing electrical components on said printed circuit board in spaced apart regions opposite said flaps, leaving the portions of said board between said flaps without electrical components; and
   (c) bending said printed circuit board so that said flaps extend over each other.

2. The method of claim 1 further including the step coupling the interconnects on said flaps to each other.

3. The method of claim 1 wherein one of said flaps on said one side of said board extends over the other of said flaps on said one side of said board.

4. The method of claim 2 wherein one of said flaps on said one side of said board extends over the other of said flaps on said one side of said board.

5. The method of claim 1 wherein said printed circuit board includes a plurality of layers of electrically insulating material and said interconnect pattern is disposed between each of said layers of electrically insulating material and on the surfaces of said electrically insulating material containing said electrical components.

6. The method of claim 2 wherein said printed circuit board includes a plurality of layers of electrically insulating material and said interconnect pattern is disposed between each of said layers of electrically insulating material and on the surfaces of said electrically insulating material containing said electrical components.

7. The method of claim 3 wherein said printed circuit board includes a plurality of layers of electrically insulating material and said interconnect pattern is disposed between each of said layers of electrically insulating material and on the surfaces of said electrically insulating material containing said electrical components.

8. The method of claim 4 wherein said printed circuit board includes a plurality of layers of electrically insulating material and said interconnect pattern is disposed between each of said layers of electrically insulating material and on the surfaces of said electrically insulating material containing said electrical components.

9. A flexible printed wiring board which comprises:
   (a) a flexible rectangular strip having an interconnect pattern thereon; and
   (b) a plurality of flaps of substantially equal length extending laterally from one of the sides of said rectangular strip, at least one of said flaps having a predetermined narrow width dimension and the terminal flap of said plurality of flaps having a relatively wide width dimension sufficient to overlap said at least one of said flaps having a predetermined narrow dimension.

10. The flexible printed wiring board of claim 9 wherein each of said flaps has substantially the same length.

11. The flexible printed wiring board of claim 9 wherein the width of said flaps having a narrow width is sufficient to contact said overlying flap of relatively wide width dimension and the width of said flap having a relatively wide width dimension is sufficient to extend over all of said flaps having a narrow width dimension.

12. The flexible printed wiring board of claim 10 wherein the width of said flaps having a narrow width is sufficient to contact said overlying flap of relatively wide width dimension and the width of said flap having a relatively wide width dimension is sufficient to extend over all of said flaps having a narrow width dimension.

13. The flexible printed wiring board of claim 9 further including a patterned interconnect disposed on said rectangular strip and extending onto said flaps.

14. The flexible printed wiring board of claim 10 further including a patterned interconnect disposed on said rectangular strip and extending onto said flaps.

15. The flexible printed wiring board of claim 11 further including a patterned interconnect disposed on said rectangular strip and extending onto said flaps.

16. The flexible printed wiring board of claim 12 further including a patterned interconnect disposed on said rectangular strip and extending onto said flaps.

17. The flexible printed wiring board of claim 13 wherein said board includes a plurality of layers of electrically insulating material and said patterned interconnect is disposed between said layers of electrically insulating material.

18. The flexible printed wiring board of claim 16 wherein said board includes a plurality of layers of electrically insulating material and said patterned interconnect is disposed between said layers of electrically insulating material.

19. A printed circuit which comprises:

(a) a flexible rectangular strip having an interconnect pattern thereon; and (b) a plurality of flaps of substantially equal length extending laterally from one of the sides of said rectangular strip, at least one of said flaps having a predetermined narrow width dimension and the terminal flap of said plurality of flaps having a relatively wide width dimension sufficient to overlap said at least one of said flaps having a predetermined narrow dimension, the width of said flaps having a narrow width being sufficient to contact said overlapping flap of relatively wide width dimension and the width of said flap having a relatively wide width dimension being sufficient to extend over all of said flaps having a narrow width dimension;

(c) a patterned interconnect disposed on said rectangular strip and extending onto said flaps;

(d) a plurality of electrical components coupled to said interconnect and disposed in the region opposed to said flaps;

(e) said narrow flaps extending toward said wider flap and said wide flap extending toward said narrow flaps and extending over said narrow flaps;

(f) the interconnects being interconnected on said flaps.

20. The printed circuit of claim 19 wherein said board includes a plurality of layers of electrically insulating material and said patterned interconnect is disposed between said layers of electrically insulating material.

* * * * *